(12) United States Patent
Yoshihara et al.

(10) Patent No.: US 9,165,797 B2
(45) Date of Patent: Oct. 20, 2015

(54) LIQUID PROCESSING APPARATUS, LIQUID PROCESSING METHOD, AND STORAGE MEDIUM

(71) Applicant: Tokyo Electon Limited, Tokyo (JP)

(72) Inventors: Kousuke Yoshihara, Kumamoto (JP); Yuichi Yoshida, Kumamoto (JP); Soichiro Okada, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 143 days.

(21) Appl. No.: 13/746,476

(22) Filed: Jan. 22, 2013

(65) Prior Publication Data
US 2013/0189852 A1 Jul. 25, 2013

(30) Foreign Application Priority Data

Jan. 25, 2012 (JP) ................. 2012-013136

(51) Int. Cl.
| B05C 13/02 | (2006.01) |
| B05C 11/10 | (2006.01) |
| H01L 21/67 | (2006.01) |
| H01L 21/02 | (2006.01) |
| G03F 7/16  | (2006.01) |

(52) U.S. Cl.
CPC ............... *H01L 21/67* (2013.01); *G03F 7/162* (2013.01); *H01L 21/02107* (2013.01); *H01L 21/6715* (2013.01); *H01L 21/67017* (2013.01)

(58) Field of Classification Search
USPC ............ 118/52, 612, 319, 320, 55, 663, 666, 118/667, 600, 602, 603, 69, 58; 427/240; 396/607, 611, 627; 134/153, 198, 902
See application file for complete search history.

(56) References Cited

U.S. PATENT DOCUMENTS

| 4,915,792 A | * | 4/1990 | Zeilon ............................. 203/22 |
| 5,733,375 A | * | 3/1998 | Fukuda et al. ................. 118/666 |
| 2008/0216740 A1 | * | 9/2008 | Hoshi ............................ 118/696 |
| 2009/0035021 A1 | * | 2/2009 | Yamamoto et al. ........... 399/222 |

FOREIGN PATENT DOCUMENTS

| JP | 07-320999 A | | 12/1995 |
| JP | 2000292932 A | * | 10/2000 |
| JP | 2001-332474 A | | 11/2001 |
| JP | 2002-023388 A | | 1/2002 |
| JP | 2004-039828 A | | 2/2004 |
| JP | 2007-299941 A | | 11/2007 |

OTHER PUBLICATIONS

English Translation of JP-2000-292932, Oct. 20, 2000.*

* cited by examiner

*Primary Examiner* — Yewebdar Tadesse
(74) *Attorney, Agent, or Firm* — Abelman, Frayne & Schwab

(57) ABSTRACT

A solvent such as PGMEA is coated on a wafer in advance to easily spread resist liquid onto the wafer on a spin chuck. Before coating, the solvent supplied from a solvent supply source is stored in a distill tank first, the solvent is heated by a heating unit to be evaporated, and the evaporated solvent is cooled by a cooler, thereby performing the purification of the solvent by distillation. Therefore, particles among the solvent are removed. The purified solvent is stored in a storage tank first, and then supplied to a solvent nozzle above the spin chuck from a solvent supplying line. And then, the solvent is coated on the wafer by ejecting the solvent from the solvent nozzle to the wafer. Further, the distill tank is cleaned periodically to suppress the increase of the concentration of the particles in the solvent.

8 Claims, 9 Drawing Sheets

LIQUID PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2012-013136, filed on Jan. 25, 2012, with the Japanese Patent Office, the disclosure of which is incorporated herein in its entirety by reference.

TECHNICAL FIELD

The present disclosure relates to a liquid processing apparatus that supplies a processing liquid to be coated on a surface of a wafer in manufacture of, for example, a semiconductor wafer.

BACKGROUND

In a photolithography process of manufacturing processes of a semiconductor device, a resist coating processing is performed to form a resist film on the surface of a semiconductor wafer ("wafer"). In general, a spin coating method is adopted as the coating processing. As illustrated in FIG. 9, the spin coating method is a method in which a resist liquid is supplied to a center portion of a wafer W from a nozzle 11 in a state where wafer W is fixed on a spin chuck 10 and is rotated in a high speed to spread the resist liquid toward the outside in a diameter direction of wafer W by centrifugal force, thereby coating the resist liquid.

When the resist liquid is coated, it is necessary to coat the resist liquid on wafer W with high in-plane uniformity. Since most of the resist liquid on wafer W is thrown out of the wafer and wasted in the spin coating method, what is required is a method to reduce the amount of the resist liquid supplied onto wafer W.

As a method to save resist, so-called a pre-wet method is known in which a processing liquid to modify a surface of a substrate is coated on a surface of the wafer prior to coating a resist liquid such that the surface of the wafer becomes wet with a solvent thereby facilitating the spread of the resist liquid (see, e.g., Japanese Patent Application Laid-Open Nos. H07-320999 and 2007-299941). When the solvent is coated, a filter with a mesh body is disposed on a flow line from a processing liquid bottle to a solvent nozzle such that foreign matter in of the solvent is filtered in the filter.

Meanwhile, as circuit patterns are being miniaturized, the presence of the foreign matter with an infinitesimal size, which has not been practically a problem until now, is expected to affect the yield. For example, foreign matter (particles) may involve foreign matter derived from a crude liquid of the processing liquid, foreign matter derived from a transporting path which is mixed while the processing liquid is passing through an apparatus from a crude liquid tank, or ionized metal. Various designs have been executed to remove the foreign matter from the processing liquid. However, there is a limit in miniaturizing meshes of filters and it is difficult to remove an ion by an existing filter.

SUMMARY

The present disclosure provides a liquid processing apparatus including: a substrate holding unit configured to hold a substrate horizontally; a processing liquid nozzle configured to perform a liquid processing with respect to the substrate horizontally held by the substrate holding unit by supplying a processing liquid from a processing liquid supply source; an evaporating unit configured to evaporate the processing liquid supplied from the processing liquid supply source to obtain vapor; a cooling unit configured to cool and liquefy the vapor of the processing liquid obtained from the evaporating unit; a storage tank configured to store the processing liquid obtained by the cooling of the cooling unit; and a liquid sending mechanism configured to send the processing liquid within the storage tank to the processing liquid nozzle.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
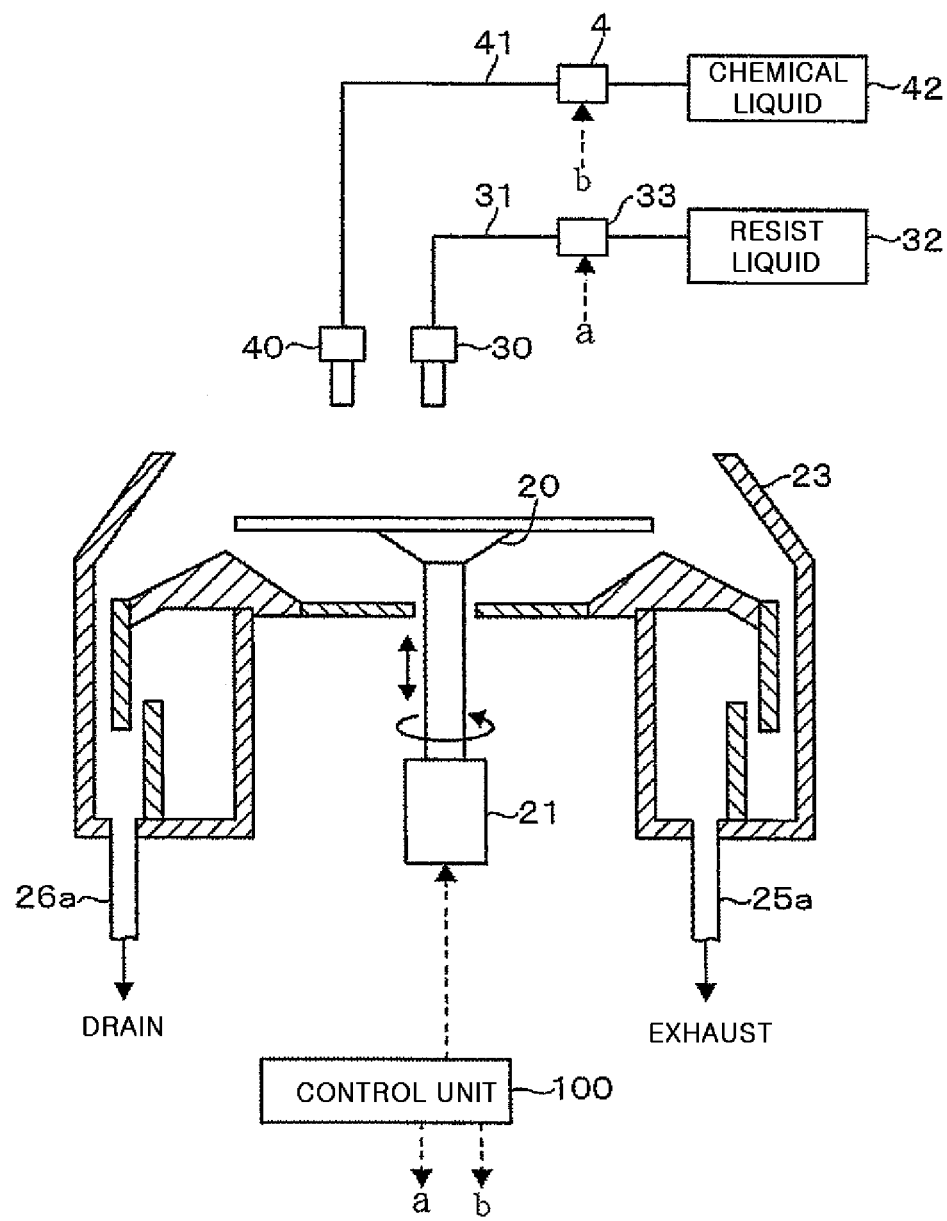
FIG. 1 is a schematic cross-sectional view illustrating a resist coating apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure has been made in an effort to provide a technology in which the entry of foreign matter from the processing liquid on the substrate is suppressed when the substrate is processed by the processing liquid.

A liquid processing apparatus of the present disclosure includes: a substrate holding unit configured to hold a substrate horizontally; a processing liquid nozzle configured to perform a liquid processing with respect to the substrate horizontally held by the substrate holding unit by supplying a processing liquid from a processing liquid supply source; an evaporating unit configured to evaporate the processing liquid supplied from the processing liquid supply source to obtain vapor; a cooling unit configured to cool and liquefy the vapor of the processing liquid obtained from the evaporating unit; a storage tank configured to store the processing liquid obtained by the cooling of the cooling unit; and a liquid sending mechanism configured to send the processing liquid within the storage tank to the processing liquid nozzle.

The above-described liquid processing apparatus further includes a resist nozzle configured to supply resist liquid with respect to the substrate held by the substrate holding unit. The processing liquid is a solvent that is ejected to the substrate before supplying the resist liquid to the substrate.

In the above-described liquid processing apparatus, the evaporating unit includes a distill tank configured to distill the processing liquid, and a heating unit configured to heat the processing liquid stored within the distill tank.

The above-described liquid processing apparatus further includes a filter unit installed in a flow line between the processing liquid supply source and the distill tank and configured to remove foreign matter.

The above-described liquid processing apparatus further includes: a gas introducing unit configured to introduce carrier gas into the distill tank, and a gas discharging unit configured to discharge the carrier gas within the storage tank.

The above-described liquid processing apparatus further includes a depressurizing exhaust line to depressurize the vapor atmosphere within the storage tank.

A liquid processing method of the present disclosure includes: obtaining vapor by evaporating a processing liquid supplied from a processing liquid supply source by an evaporating unit; obtaining a processing liquid by cooling and liquefying the vapor by a cooling unit installed in a flow line between the evaporating unit and a storage tank; storing the processing liquid obtained by the cooling of the cooling unit in the storage tank; and performing a liquid processing by supplying the processing liquid within the storage tank through a processing liquid nozzle to a substrate horizontally held by a substrate holding unit.

In the above-described liquid processing method, the processing liquid is a solvent, and a resist liquid is supplied to the substrate from a resist nozzle after performing the liquid processing.

In the above-described liquid processing method, the vapor obtaining step includes: storing the processing liquid in a distill tank and heating the processing liquid stored within the distill tank.

The above-described liquid processing method further includes passing the processing liquid through a filter unit installed in a flow line between the processing liquid supply source and the evaporating unit prior to evaporating the processing liquid of the processing liquid supply source.

The present disclosure also provides a non-transitory computer-readable storage medium storing a computer program that, when executed, causes a computer to perform the above-described liquid processing method.

According to the present disclosure, the processing liquid supplied from the processing liquid supply source is evaporated by the evaporating unit to obtain vapor, a processing liquid obtained by cooling and liquefying the vapor is supplied from the nozzle to the substrate, thereby performing the liquid processing. Accordingly, the foreign matter (for example, particles or ionized metals) among the processing liquid may be reduced. As a result, the entry of the foreign matter from the processing liquid on the substrate is suppressed, which is extremely effective for the semiconductor device manufacturing technology in which, for example, the minuteness of a circuit pattern proceeds.

Hereinafter, a first exemplary embodiment will be described in which a liquid processing apparatus of the present disclosure is applied to a resist coating apparatus.

First, the entire configuration of a resist coating apparatus will be described briefly. As illustrated in FIG. 1, the resist coating apparatus includes: a cup module including a spin chuck 20 configured to hold a wafer W, which is a substrate, horizontally, and a cup body 23; a solvent nozzle 40 configured to supply a solvent to wafer W; and a resist nozzle 30 configured to supply a resist liquid to wafer W. The cup module is configured to receive and discharge, for example, the solvent scattered from wafer W from a drain line 26a in the bottom side, and to exhaust gas from an exhaust line 25a in the bottom side, thereby preventing mist from being scattered to the processing atmosphere.

Solvent nozzle 40 is connected to a solvent supply source 42 via a solvent supplying line 41, and a solvent supplying device 4 is installed on the way of solvent supplying line 41. Resist nozzle 30 is connected to a resist supply source 32 via a resist supplying line 31, and a resist supplying device 33 is installed on the way of resist supplying line 31.

Solvent supplying device 4 and resist supplying device 33 include a supply control mechanism group including, for example, a valve, a filter, and a pump. Hereinafter, solvent supplying device 4 will be described in detail.

Figure 2:
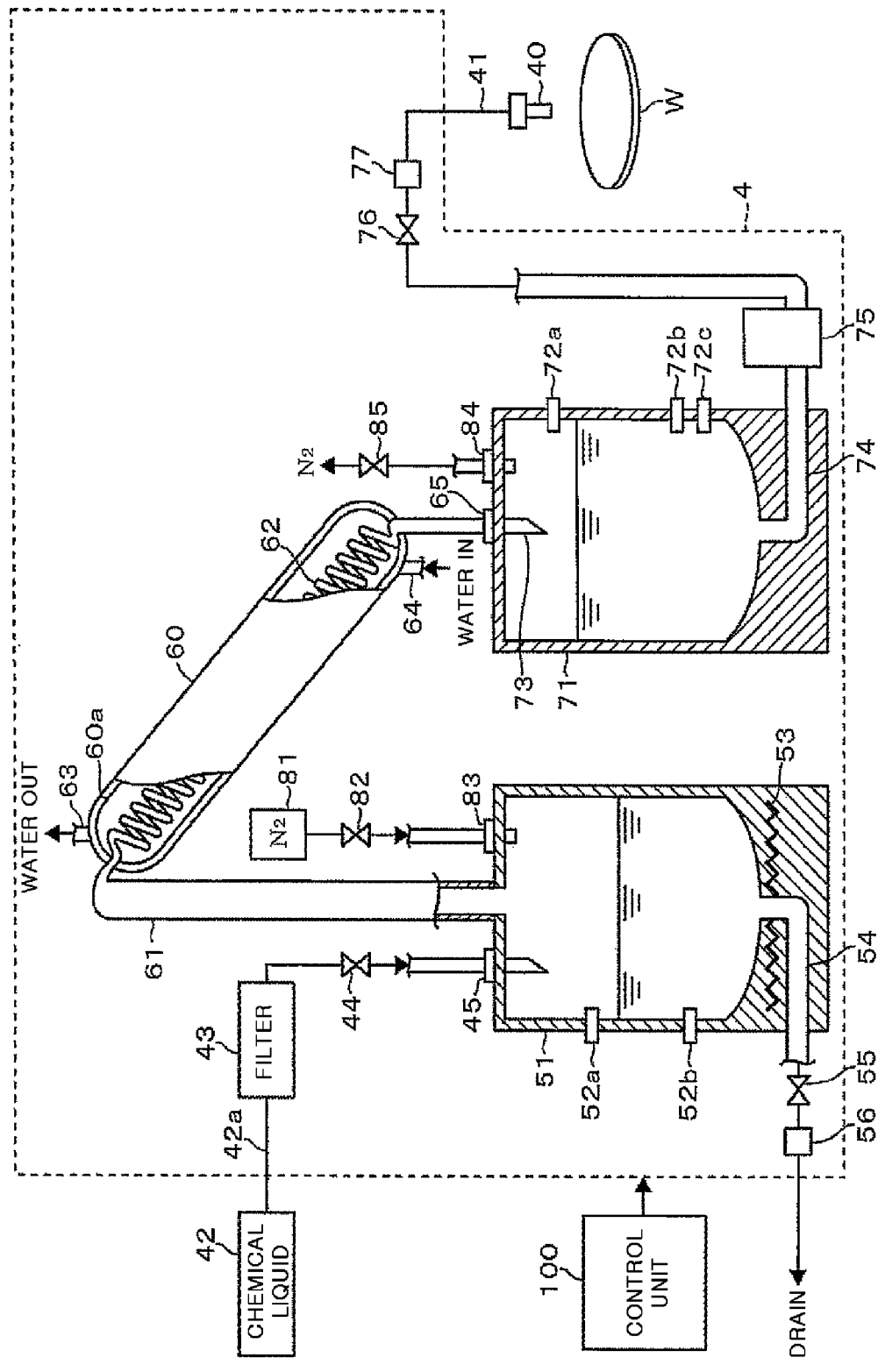
FIG. 2 is a side view in partial cross-section illustrating an exemplary embodiment of a liquid processing apparatus that configures the resist coating apparatus according to the exemplary embodiment of the present disclosure.

As illustrated in FIG. 2, solvent supplying device 4 includes a distill tank 51, and a solvent supplying port 45 is formed in the top of distill tank 51. One end of a pipe 42a is connected to solvent supplying port 45, and other end is connected to solvent supply source 42. A filter 43 and a valve 44 are interposed in pipe 42a. A heating unit 53 to heat the solvent in distill tank 51 is installed in the bottom side of distill tank 51. Therefore, the solvent may be heated up to a constant temperature equal to or higher than the boiling point of the solvent. Distill tank 51 is provided with a high-level (H) sensor 52a to detect a liquid surface at a high-level and a low-level (L) sensor 52b to detect a liquid surface at a low-level.

The bottom portion within distill tank 51 is curved, and the center portion thereof is provided with a drain line 54 to discharge the solvent. The control of the discharge of the solvent via drain line 54 is performed by opening/closing a drain valve 55, and the solvent is discharged through a flow rate meter 56. Distill tank 51 is provided with a carrier gas introducing port 83 at the top thereof to introduce carrier gas into distill tank 51. The carrier gas is supplied from a carrier gas supply source 81 into distill tank 51 through a gas valve 82. In the present exemplary embodiment, distill tank 51, heating unit 53, and carrier gas introducing port 83 constitute an evaporating unit to evaporate the solvent.

To the center of the top of distill tank 51, a lower end of a recovery pipe 61 is connected to recover the evaporated solvent. Recovery pipe 61 extends vertically upright, and the top end thereof is bent with an acute angle to extend downward obliquely in a spirally shaped state. The spirally shaped pipe portion corresponds to an inner pipe of a cooler 60, and the inner pipe is accommodated in an outer pipe 60a of which both top and bottom surfaces are curved. The bottom portion of outer pipe 60a is installed with an injecting port 64 to inject cooling water as a cooling liquid into the outer pipe, the top portion of outer pipe 60a is installed with a discharging port 63 to discharge the cooling water. That is, the vapor of a chemical liquid recovered by recovery pipe 61 enters to inner pipe 62, and is liquefied as inner tube 62 is water-cooled within cooler 60. In this manner, the solvent within distill tank 51 is purified.

The solvent purified in cooler 60 is recovered to a storage tank 71 from a solvent recovery port 65 formed on the top of storage tank 71 via a recovery pipe 73 that extends from the lower end of inner pipe 62. The inside of storage tank 71 is provided with a high-level (H) sensor 72a to detect a liquid surface at a high-level, a low-level (L) sensor 72b to detect a liquid surface at a low-level, and a ultra low-level (LL) sensor 72c to detect a liquid surface at a ultra low-level. The bottom portion within storage tank 71 is curved, and a solvent supplying line 74 is connected to the center of the bottom portion to supply solvent to wafer W through solvent nozzle 40. The storage tank 71 is provided with a carrier gas discharging port 84 at the top thereof to discharge the carrier gas to the outside through a gas valve 85.

Solvent supplying line 74 is provided with a liquid send pump 75, a discharging valve 76, and a flow rate meter 77 which constitute a liquid sending mechanism, and solvent nozzle 40 is connected to the front end of the solvent supplying line 74.

Here, a solvent for pre-wetting which is capable of being processed in the present resist coating apparatus may be, for example, PGMEA, PGME, cyclohexanone, γ-butyl lactone, butyl acetate, or MAK (2-heptanone). An available carrier gas may be, for example, $N_2$ gas or helium.

The resist coating apparatus is configured to be controlled by a control unit 100, as illustrated in FIG. 1. Control unit 100 includes, for example, a computer, and is provided with a program, a memory and a CPU. Commands (respective steps) are stored in the program such that a control signal is transmitted from control unit 100 to execute the operations as described below, thereby performing a predetermined solvent processing. The program is stored in a computer-readable storage medium, for example, a recording unit such as, for example, a flexible disc, a compact disc, a hard disc, and a MO (a magneto-optical disc) and is installed in control unit 100. Here, the program installed in control unit 100 includes a program that controls, for example, spin chuck 20, resist nozzle 30, resist supply source 32, resist supplying device 33, solvent nozzle 40, solvent supply source 42, valve 44, heating unit 53, H sensor 52a, L sensor 52b, drain valve 55, flow rate meter 56, cooler 60, H sensor 72a, L sensor 72b, LL sensor 72c, liquid send pump 75, discharging valve 76, flow rate meter 77, carrier gas supply source 81, gas valve 82, and gas valve 85 such that each of these components may be controlled based on a program recipe stored in the memory of control unit 100 in advance.

Next, the operations of the above-mentioned exemplary embodiment will be described. First, the solvent for pre-wetting processing is supplied from solvent supply source 42 to solvent supplying device 4 through solvent supplying line 41. In FIG. 2, the solvent such as, for example, PGMEA supplied to solvent supplying device 4 from solvent supply source 42 is filtered with a filer 43 for a rough filtration. In this way, particles of which sizes are equal to or more than the mesh of the filter are removed. The filtered solvent is supplied into distill tank 51 through valve 44 and solvent supplying port 45.

The solvent supplied into distill tank 51 is heated by heating unit 53 to be evaporated. Here, the temperature of heating unit 53 is set to a temperature higher than, for example, the boiling point of PGMEA, for example, 160. The evaporated solvent is sent to recovery pipe 61 using $N_2$ gas as a carrier gas, in which the $N_2$ gas is supplied into distill tank 51 from carrier gas supply source 81.

When the solvent is evaporated as described above, the storage of the solvent within distill tank 51 is performed at the same time. In addition, control is performed in such a manner that when the liquid surface arrives at a level higher than H sensor 52a, the supply of the solvent from solvent supply source 42 is stopped by, for example, closing valve 44 and when the liquid surface arrives at a level lower than L sensor 52b, the supply of the solvent from solvent supply source 42 is continued again. The solvent is continuously supplied from solvent supply source 42 when the liquid surface is positioned between H sensor 52a and L sensor 52b. As described above, the liquid surface of the solvent within distill tank 51 is normally maintained between H sensor 52a and L sensor 52b, thereby preventing the heating of empty distill tank 51 or the oversupplying of the solvent.

Meanwhile, the solvent vapor sent along with $N_2$ gas to recovery pipe 61 enters to inner pipe 62 of cooler 60, and is water-cooled by the cooling water. Then, the solvent vapor is liquefied and dropped to the bottom side of inner pipe 62. As described above, particles are removed from the solvent refined by the distillation. The purified and dropped solvent is recovered to storage tank 71 through recovery pipe 73. $N_2$ gas including a non-liquefied solvent component flows through storage tank 71, and then, is discharged to the outside from carrier gas discharging port 84 through gas valve 85.

Here, when the liquid surface arrives at a level higher than H sensor 72a, the supply of $N_2$ gas from carrier gas supply source 81 is stopped, heating unit 53 is deactivated, and the purification of the solvent is stopped. When the liquid surface arrives at a level lower than L sensor 72b, the supply of $N_2$ gas from carrier gas supply source 81 is continued again, heating unit 53 is activated, and the purification of the solvent is continued again. When the liquid surface is positioned between H sensor 72a and L sensor 72b, the supply of $N_2$ gas and the operation of heating unit 53 are continued, and thus, the solvent is continuously refined. In this way, the liquid surface of the refined solvent within storage tank 71 is normally maintained between H sensor 72a and L sensor 72b.

When the supply amount of solvent purified by distillation to storage tank 71 is smaller than the amount of the solvent ejected to wafer W and the liquid surface becomes lower than LL sensor 72c, the supply of the solvent to solvent nozzle 40 is stopped. In this way, the shortage of the amount of the solvent to be ejected to wafer W is prevented in advance.

When the purified solvent is stored in storage tank 71 with an amount sufficient for continuous processing of wafers, the process proceeds to a step of coating purified solvent to wafer W.

Meanwhile, wafer W is transferred onto spin chuck 20 from a transporting mechanism (not illustrated) in the outside of the resist coating apparatus, then is adsorbed and held by spin chuck 20. Then, solvent nozzle 40 is moved above the center portion of wafer W, and the solvent is supplied in a controlled manner such that a suitable amount of the solvent is ejected to solvent nozzle 40 from solvent supplying device 4.

After the solvent is ejected from solvent nozzle 40 onto wafer W, rotation driving unit 21 is controlled to increase the number of revolutions of wafer W, and thus, the solvent is diffused toward the outside by centrifugal force. Accordingly, a process for wetting the entire surface of wafer W by the solvent, that is, pre-wetting is performed. Also, the solvent may be supplied in a state where wafer W is being rotated. After the pre-wetting is completed, solvent nozzle 40 is retracted from the upper side of the center portion of wafer W, and resist nozzle 30 is moved to the upper side of the center portion of wafer W instead. The ejection of the resist liquid from resist nozzle 30 is initiated, and the number of revolutions of wafer W is controlled using, for example, a method disclosed in Japanese Patent Application Laid-Open No. 2007-299941, so that the resist liquid is diffused on wafer W. Since the pre-wetting processing has already been performed for wafer W, the resist liquid is steadily and smoothly diffused and spread in a stripe shape. Therefore, uneven coating is hardly caused.

However, as the above-described solvent supplying device 4 is continuously operated, the concentration of the particles in the solvent stored in distill tank 51 will be increased. For that reason, the present resist coating apparatus provides a cycle to refresh the inside of distill tank 51 by periodically wasting the solvent in the inside of distill tank 51 from drain line 54 of the bottom portion of distill tank 51.

An example of the cycle, a timing to open drain valve 55 is determined based on the total count number of processed wafers or integrated flow rate of the solvent, a length of time required for fully discharging the solvent is calculated based on the amount of the solvent within distill tank 51 at the timing, valve 44 is closed, the supply of the solvent from solvent supply source 42 is stopped, and then, drain valve 55 is opened for the calculated length of time to drain the solvent. After the drain is completed, distill tank 51 may be cleaned by a cleaning liquid. As cleaning methods, a cleaning by the solvent (that is, a common cleaning) and a cleaning by acid to remove metallic ions attached on the inner wall of distill tank 51 may be considered. After draining or after cleaning (in case of using an acid, after a common cleaning by the solvent after the cleaning by the acid), drain valve 55 is closed again, and the supply of the solvent from solvent supply source 42 to distill tank 51 is continued again. Further, in the cleaning cycle, when the sufficient liquid amount exists in storage tank 71, the cleaning cycle within distill tank 51 and the supply of the purified solvent from storage tank 71 to wafer W may be performed at the same time.

According to the exemplary embodiment, in the resist coating processing which is a liquid processing, since the pre-wetting solvent for wetting the surface of wafer W in advance is distilled by the distill tank and the processing liquid obtained thereby is supplied to the substrate from the nozzle to perform the liquid processing, foreign matter (for example, particles or ionized metal) in the processing liquid is reduced. As a result, the entry of the foreign matter to the substrate from the processing liquid is suppressed, which suppresses the decrease of a yield in manufacturing, for example, semiconductor devices, of which the circuit patterns are being miniaturized.

The purified solvent is secured in a dedicated tank by an amount required for a processing after the distillation. As a result, since the refined solvent may be steadily supplied to surfaces of wafers, the surfaces of the wafers may be continuously processed by the solvent containing a suppressed amount of particles in a pre-wetting processing.

MODIFIED EXAMPLES OF PROCESSING LIQUID SUPPLYING DEVICE

Next, modified examples of solvent supplying device 4 in the liquid processing apparatus of the first exemplary embodiment will be described. Further, the parts corresponding to those of the above-described exemplary embodiment will be denoted by the same reference numerals, and the descriptions thereof will be omitted.

Modified Example 1

Figure 3:
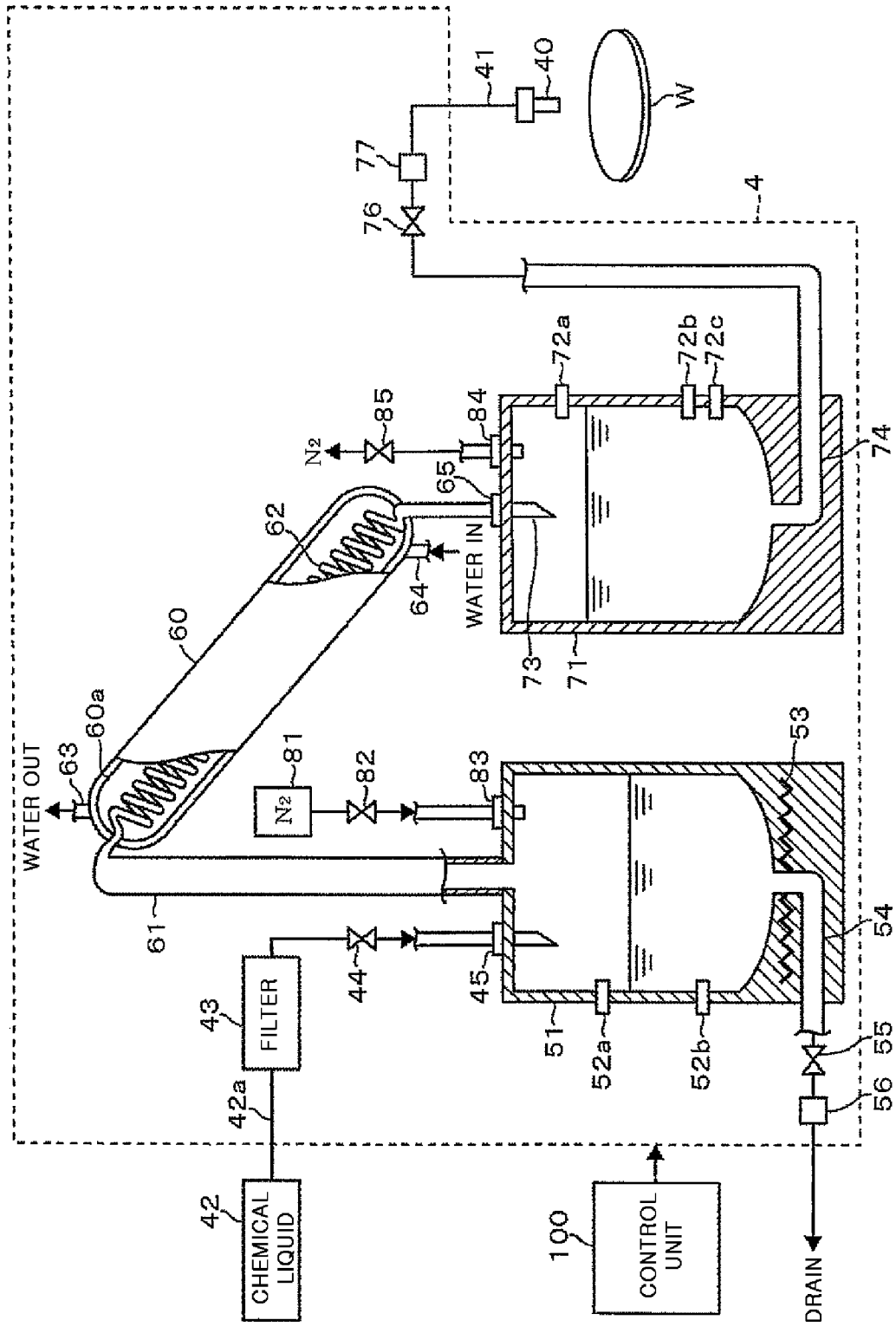
FIG. 3 is a side view in partial cross-section illustrating another embodiment of the liquid processing apparatus of the present disclosure.

In the example as illustrated in FIG. 3, liquid send pump 75 that was used in the above-described exemplary embodiment is omitted. When the solvent is not supplied to wafer W, after discharging valve 76 is closed, the carrier gas is supplied from carrier gas supply source 81 through recovery pipe 61, inner pipe 62 of cooler 60 and recovery pipe 73, and is discharged to the outside of storage tank 71 through gas valve 85. When the solvent is ejected to wafer W, after gas valve 85 is closed, discharging valve 76 is opened, and the solvent is ejected to wafer W from solvent nozzle 40 from simultaneously with discharging the carrier gas.

That is, this example is a configuration where a carrier gas supplying mechanism is used instead of the pump as a liquid sending mechanism that sends the solvent to nozzle 40, and the discharging pressure of the carrier gas is used to send the solvent at discharging valve 76.

Modified Example 2

Figure 4:
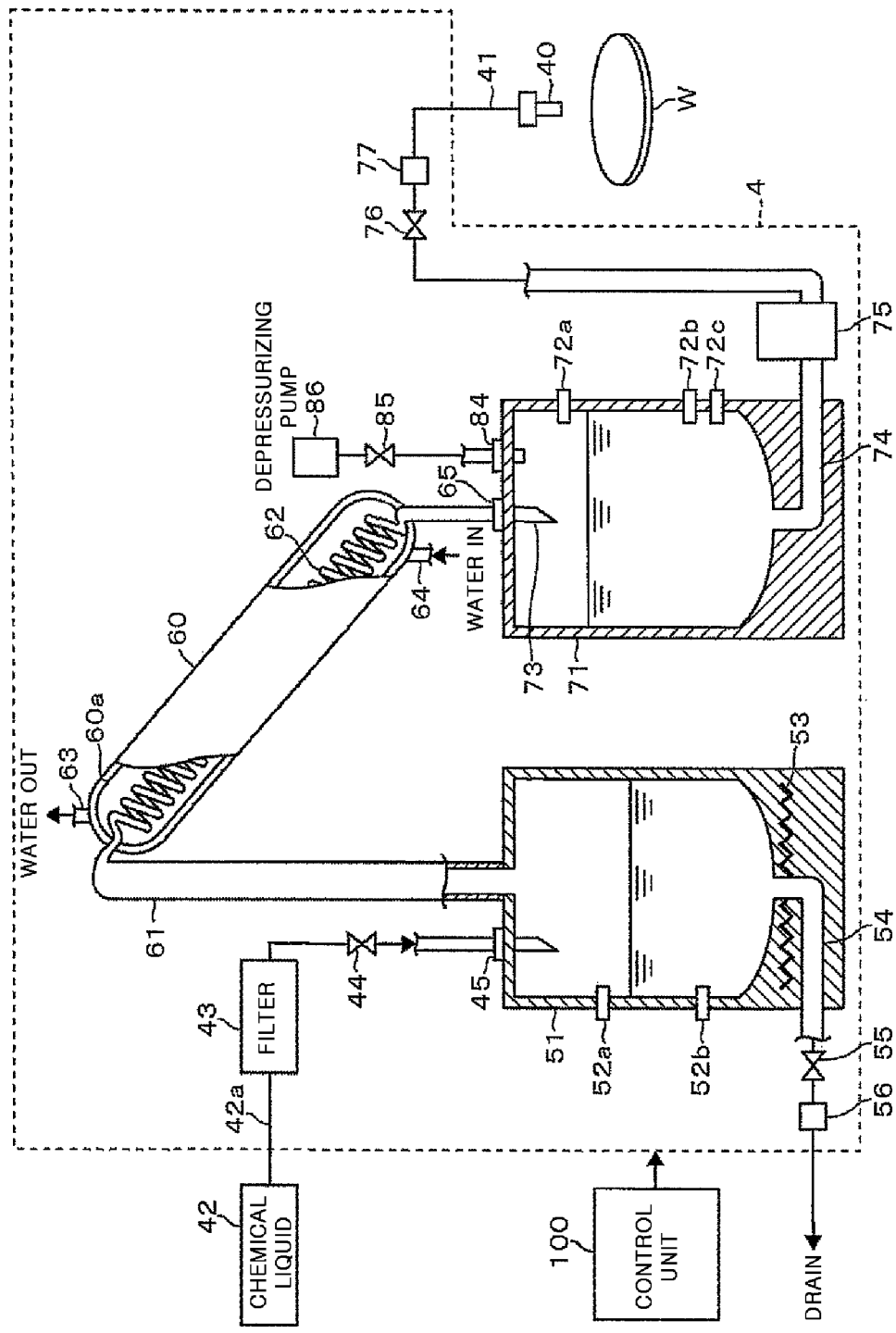
FIG. 4 is a side view in partial cross-section illustrating even another embodiment of the liquid processing apparatus of the present disclosure.

In the example as illustrated in FIG. 4, a depressurizing pump 86 which is a depressurizing mechanism (suction mechanism) is connected to storage tank 71 through gas valve 85, in place of a suction/exhaust device for the carrier gas. Distill tank 51 and storage tank 71 are configured as a vacuum insulation tank. At the time of distilling, after valve 44 is closed to form the vapor phase space as a closed system, depressurizing pump 86 is driven and the solvent of distill tank 51 is heated by heating unit 53. At that time, since the pressure within the system is lowered, the boiling point of the solvent is also lowered. When the solvent is ejected to wafer W, the solvent is controlled by liquid send pump 75 and discharging valve 76.

In this modified example, since the boiling point of the solvent is lowered, the output of heating unit 53 that heats the solvent may be decreased. Accordingly, it can be expected that a yield may be improved in addition to enabling energy saving.

Modified Example 3

Figure 5:
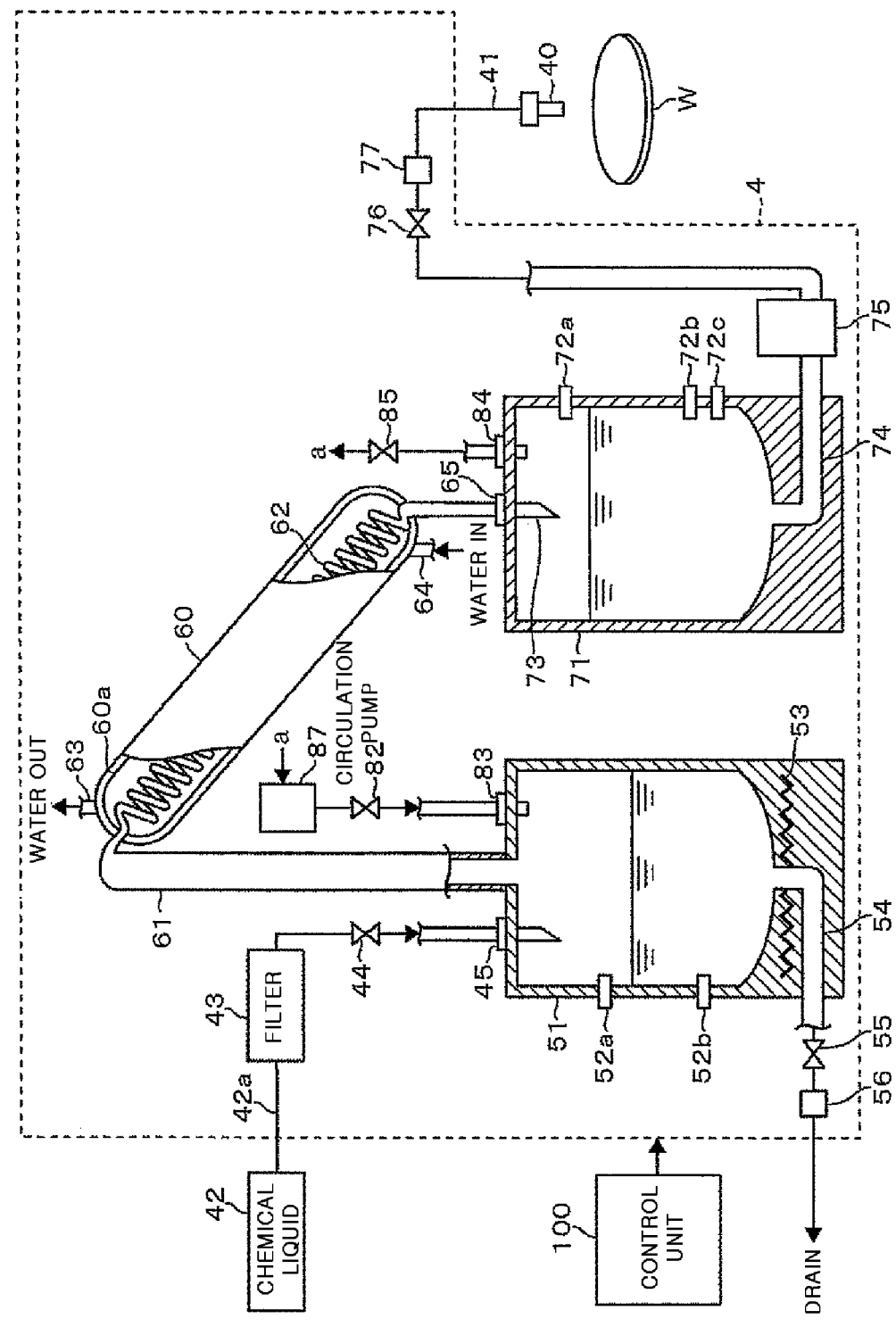
FIG. 5 is a side view in partial cross-section illustrating still another embodiment of the liquid processing apparatus of the present disclosure.

In the example as illustrated in FIG. 5, a circulation pump 87 is connected between gas valve 82 and gas valve 85, in place of the suction/exhaust device for the carrier gas. At the time of distilling, valve 44 and discharging valve 76 are closed. Therefore, a circulation system is formed where the inner air is circulated from distill tank 51 through cooler 60, and to storage tank 71, gas valve 85, circulation pump 87, gas valve 82, and distill tank 51. When the solvent is ejected to wafer W, discharging valve 76 is turned to the opened state and liquid send pump 75 is driven.

In the modified example, since the solvent vapor not liquefied in cooler 60 may be returned to distill tank 51 again, the recovery efficiency of the refined solvent is increased.

Modified Example 4

Figure 6:
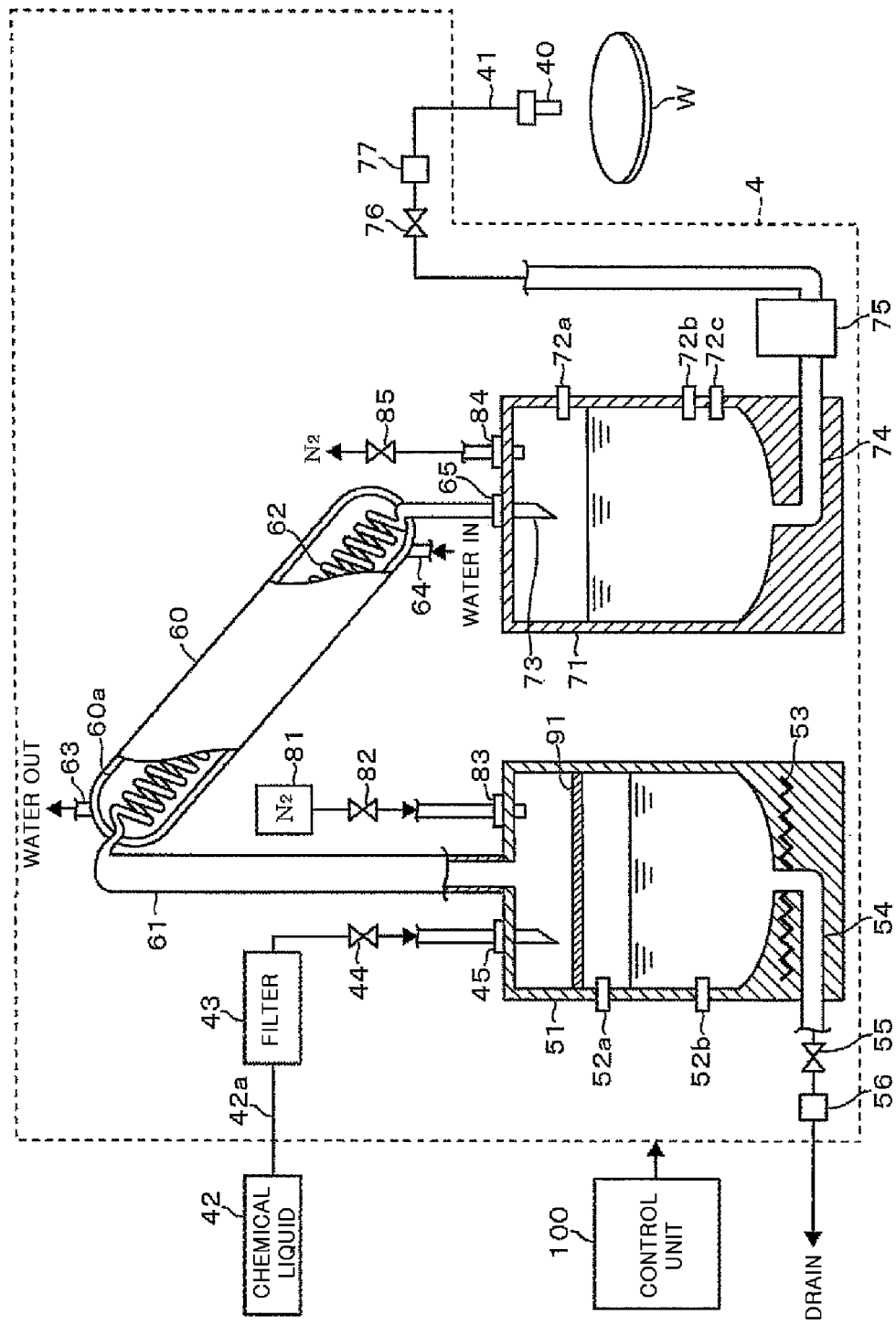
FIG. 6 is a side view in partial cross-section illustrating still another embodiment of the liquid processing apparatus of the present disclosure.

In the example as illustrated in FIG. 6, a mesh type or porous filter 91 formed as a size suitable for the transverse cross-section of distill tank 51 is installed in a vapor phase area within distill tank 51. When liquid surface becomes unstable due to, for example, bumping of solvent, a liquid lump containing particles or solvent mist is prevented from being mixedly introduced into recovery pipe 61 by filter 91. A single filter 91 may be used, but a plurality of filters may be used in combination. As a material of the filter, for example, a fluorinated carbon resin (product name: Teflon (registered trademark)) may be used.

Filter 91 may be combined with the above-described exemplary embodiment or each of the modified examples.

Modified Example 5

Figure 7:
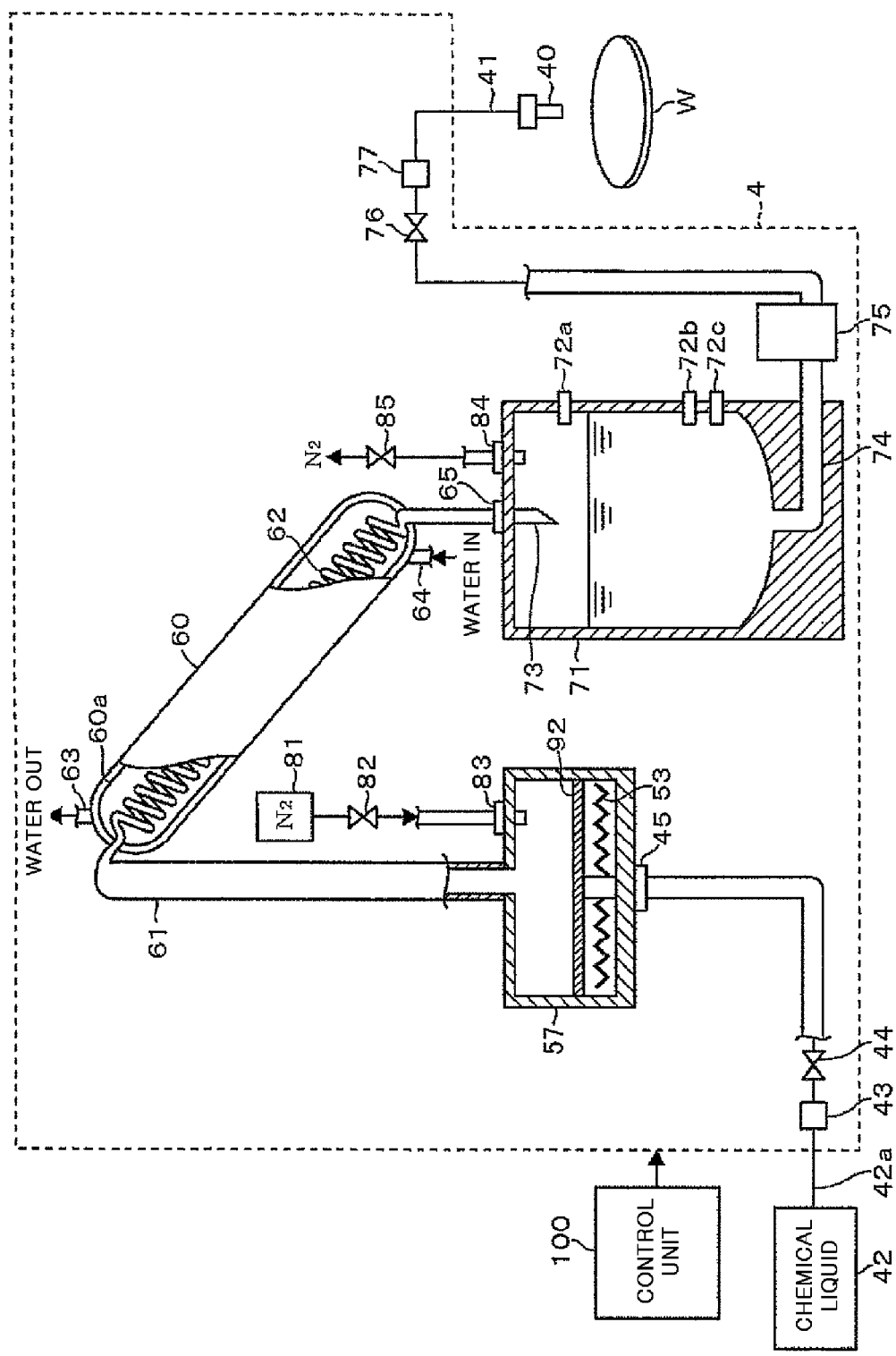
FIG. 7 is a side view in partial cross-section illustrating still another embodiment of the liquid processing apparatus of the present disclosure.

In the example as illustrated in FIG. 7, a vaporizer 57 is used as the evaporating unit, instead of using distill tank 51.

Vaporizer 57 includes a flat cylindrical housing, a volatizing member 92 installed in a transverse direction within the housing, and a heating unit 53 that heats volatizing member 92. To the top of the housing, the upstream end of recovery pipe 61 is connected, and the carrier gas supplying line is also connected through carrier gas introducing port 83. The surface of volatizing member 92 is formed as a volatizing surface of the solvent, and, for example, is configured such that an outlet of the downstream end of pipe 42 is connected to the center portion of the volatizing surface and the solvent is supplied to the volatizing surface from the outlet.

An example of the volatizing surface may be a structure configured such a plurality of elongated recesses are formed to extend radially from the center portion and the solvent from the outlet is spread to the entire volatizing surface by capillary phenomenon. For example, a porous structure may be used as volatile member 92, and the outlet may be opened within the porous structure, so that the solvent from the outflow port may be absorbed into the porous structure, and volatilized from the top surface of the porous structure (volatizing surface).

In this example, the solvent maintained in volatizing member 92 is heated by heating unit 53, and the solvent vapor is sent to recovery pipe 61 along with the carrier gas. Although the carrier gas within the system is flown by the carrier gas mechanism in this example, the pressure within the system may be controlled using the gas control mechanism by the vacuum suction of modified example 2.

Since the solvent is supplied to volatizing member 92 and continuously evaporated, vaporizer 57 has no liquid layer when viewed macroscopically. As a result, the mixed introduction of liquid lump or solvent mist to recovery pipe 61 is prevented.

Modified Example 6

Figure 8:
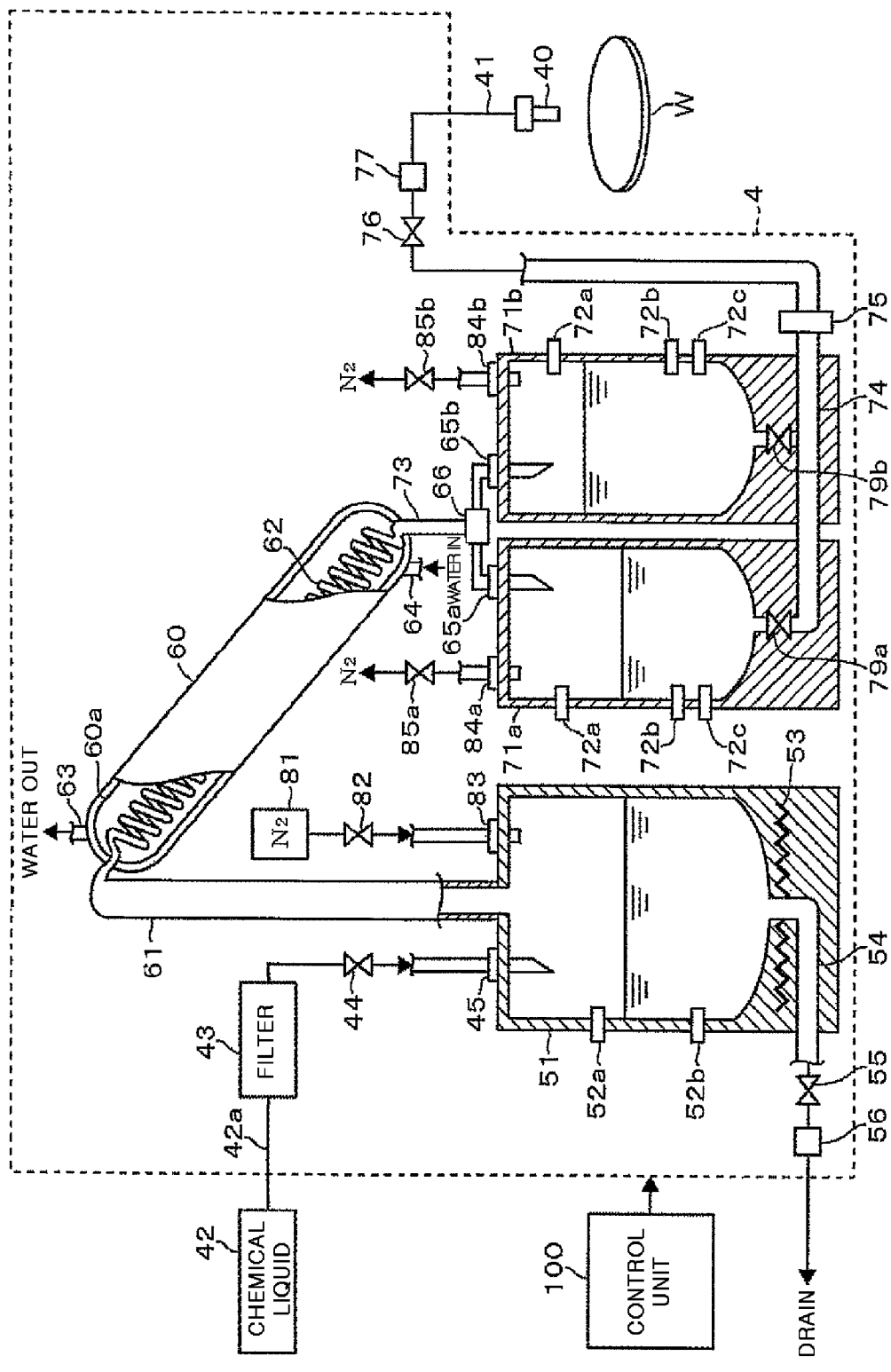
FIG. 8 is a side view partial in cross-section illustrating still another embodiment of the liquid processing apparatus of the present disclosure.
Figure 9:
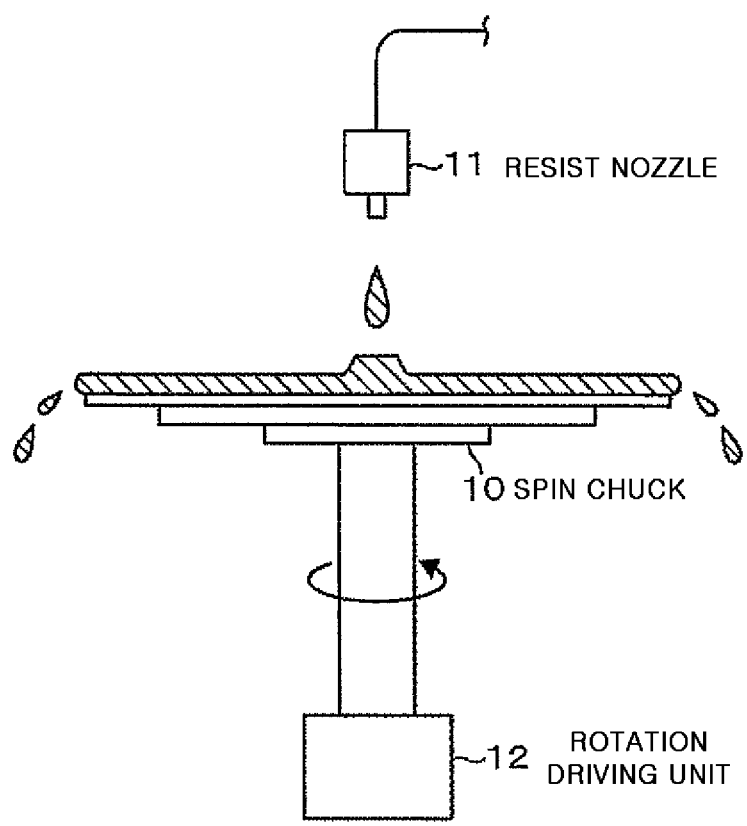
FIG. 9 is an explanatory diagram illustrating how a resist liquid dropped on a surface of a wafer is spread on the surface of the wafer in the related art.

In the example as illustrated in FIG. 8, a first storage tank 71a and a second storage tank 71b are installed as storage tank 71. A liquid level sensor mechanism and a carrier gas discharging mechanism installed in each of the tanks are the same as those provided in storage tank 71 in the above-described exemplary embodiment. The purified solvent recovered from recovery pipe 73 is distributed to storage tanks 71a, 71b from solvent recovery ports 65a, 65b through a flow rate meter 66 based on a situation of, for example, the storage amount of the tank. Valves 79a, 79b are provided in the discharging ports for the purified solvent from tanks 71a, 71b, respectively, thereby controlling discharge of the solvent. Storage tanks 71a, 71b cooperate based on the situation of, for example, the storage amount of the tank to perform the storage of the refined solvent and the supply of the solvent to wafer W.

Three or more storage tanks may be used. Since the plural storage tanks are used, the discharge of the purified solvent may be continued stably.

In the solvent supplying device as described above, the solvent is filtered with filter 43 attached to the outside. Even though filter 43 is a filter accommodated in the pipe, the same configuration of the apparatus is possible. In addition, filter 43 is not always necessarily required.

Although cooler 60 as described above has is configured such that inner pipe 62 is water-cooled in the inside of outer pipe 60a to perform distillation, it is not limited thereto if cooler 60 is configured such that solvent vapor is distilled by cooling and purified solvent obtained thereby is recovered to storage tank 71. For example, a Peltier element may be provided in the cooling unit, the both ends of the inner pipe may be installed in the top portion, and the body of the inner pipe may be cooled by a flask type cooling mechanism.

Further, it may be also considered that a temperature sensor is installed in distill tank 51, the temperature of the liquid within distill tank 51, which is detected by a sensor unit, always be monitored, and the output of heating unit 53 is controlled based on the monitored temperature of the liquid to control the temperature of the liquid in real time. In this case, distill tank 51 may be prevented from being overheated even in a case where, for example, the liquid surface within distill tank 51 is extremely lowered.

Meanwhile, a temperature controlling function may be provided to storage tank 71 to maintain the purified solvent within storage tank 71 to, for example, a room temperature at all time. The reason why the solvent is maintained to the room temperature is that, because wafer W and resist liquid are normally maintained to the room temperature at the time of processing, the in-plane uniformity in the resist film coating processing may be improved by decreasing the temperature difference between the solvent and the substrate.

A mechanism configured to reduce the pressure within the system by discharging the gas within the system from gas valve 85 may be used in place of the suction/discharge device of the carrier gas. When the pressure within the system is increased, gas valve 85 is opened and discharging valve 76 is closed. At that time, the discharge of the solvent is stopped. Meanwhile, when the solvent is ejected to wafer W, the solvent is controlled by closing gas valve 85 and opening discharging valve 76. When the solvent before distilling is in a great quantity and it is expected that purified solvent will also be obtained in a great quantity, the suction/discharging device using, for example, a carrier gas may be omitted by controlling the discharge of the solvent by discharging valve 76 and gas valve 85.

The examples of the processing liquids which may be handled in the present apparatus other than the solvent for pre-wetting processing may include, for example, MIBC used in a pre-wetting processing after forming a resist protective film, isopropyl alcohol used in cleaning a wafer, water used in rinsing a wafer, and a solvent used as so-called edge-remover to remove a resist film in a circumference edge of a wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A liquid processing apparatus comprising:
   a substrate holding unit configured to hold a substrate horizontally;
   a solvent nozzle configured to perform a liquid processing with respect to the substrate horizontally held by the substrate holding unit by supplying a solvent from a solvent supply source;
   an evaporating unit configured to evaporate the solvent supplied from the solvent supply source to obtain vapor of the solvent and transfer the vapor of the solvent to a next stage using a carrier gas supplied from a carrier gas supply source;

a cooling unit configured to cool and liquefy the vapor of the solvent transferred from the evaporating unit to the cooling unit by the carrier gas;

a storage tank configured to store the solvent obtained by the cooling of the cooling unit;

a liquid sending mechanism configured to send the solvent within the storage tank to the solvent nozzle; and a controller programmed to supply the solvent to the substrate through the solvent nozzle prior to supplying a resist liquid to the substrate, wherein the evaporating unit and the cooling unit are connected with a recovery pipe that extends vertically upright, and the top end thereof is bent with an acute angle to extend downward obliquely in a spirally shaped state.

2. The liquid processing apparatus of claim 1, further comprising a resist nozzle configured to supply the resist liquid with respect to the substrate held by the substrate holding unit.

3. The liquid processing apparatus of claim 1, wherein the evaporating unit comprises: a distill tank configured to distill the solvent, and a heating unit configured to heat the solvent stored within the distill tank.

4. The liquid processing apparatus of claim 3, further comprising: a filter unit installed in a flow line between the solvent supply source and the distill tank and configured to remove foreign matter.

5. The liquid processing apparatus of claim 4, further comprising: a gas introducing unit configured to introduce carrier gas into the distill tank, and a gas discharging unit configured to discharge the carrier gas within the storage tank.

6. The liquid processing apparatus of claim 1, further comprising a depressurizing exhaust line to depressurize the vapor atmosphere within the storage tank.

7. The liquid processing apparatus of claim 1, wherein the storage tank is further configured to discharge the carrier gas used to transfer the vapor of the solvent from the evaporating unit to the cooling unit to the outside.

8. The liquid processing apparatus of claim 1, wherein the solvent includes PGMEA, PGME, cyclohexanone, γ-butyl lactone, butyl acetate, or MAK (2-heptanone).

* * * * *